(12) United States Patent
Chen et al.

(10) Patent No.: US 7,486,534 B2
(45) Date of Patent: Feb. 3, 2009

(54) DIODE-LESS ARRAY FOR ONE-TIME PROGRAMMABLE MEMORY

(75) Inventors: Kuan Fu Chen, Taipei (TW); Yin Jen Chen, Wugu Township, Taipei County (TW); Tzung Ting Han, Yilan (TW); Ming Shang Chen, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 284 days.

(21) Appl. No.: 11/297,529

(22) Filed: Dec. 8, 2005

(65) Prior Publication Data

US 2007/0133248 A1 Jun. 14, 2007

(51) Int. Cl.
*G11C 17/00* (2006.01)

(52) U.S. Cl. .......................... 365/96; 365/63

(58) Field of Classification Search .................... 365/63, 365/94, 96, 225.7; 257/208, 209, 210, 211, 257/529, 665, 686

See application file for complete search history.

(56) References Cited

U.S. PATENT DOCUMENTS

| | | | |
|---|---|---|---|
| 3,909,805 A | 9/1975 | Touron et al. | |
| 4,494,135 A | 1/1985 | Moussie | |
| 4,569,120 A | 2/1986 | Stacy et al. | |
| 4,597,162 A | 7/1986 | Johnson et al. | |
| 5,286,993 A * | 2/1994 | Lowrey et al. | 257/390 |
| 5,311,053 A | 5/1994 | Law et al. | |
| 5,684,732 A | 11/1997 | Sako | |
| 5,835,396 A * | 11/1998 | Zhang | 365/51 |
| 6,034,882 A | 3/2000 | Johnson et al. | |
| 6,154,851 A | 11/2000 | Sher et al. | |
| 6,339,559 B1 | 1/2002 | Bertin et al. | |
| 6,351,406 B1 | 2/2002 | Johnson et al. | |
| 6,385,075 B1 | 5/2002 | Taussig et al. | |
| 6,438,059 B2 | 8/2002 | Akita et al. | |
| 6,525,953 B1 | 2/2003 | Johnson | |
| 6,545,898 B1 | 4/2003 | Scheuerlein | |
| 6,567,295 B2 | 5/2003 | Taussig et al. | |
| 6,567,301 B2 | 5/2003 | Anthony et al. | |
| 6,584,029 B2 * | 6/2003 | Tran et al. | 365/225.7 |
| 6,687,147 B2 * | 2/2004 | Fricke et al. | 365/63 |
| 6,750,753 B2 * | 6/2004 | Yang | 337/297 |
| 6,813,182 B2 | 11/2004 | Perlov et al. | |
| 6,858,916 B2 | 2/2005 | Sakoh | |

* cited by examiner

*Primary Examiner*—VanThu Nguyen
*Assistant Examiner*—Alexander Sofocleous
(74) *Attorney, Agent, or Firm*—Jianq Chyun IP Office

(57) ABSTRACT

A one-time programmable memory array includes a first row conductor extending in a first row direction and disposed at a first elevation, a second row conductor extending in a second row direction and disposed at a second elevation and a column conductor extending in a column direction and disposed adjacent to the first row conductor and adjacent to the second row conductor. The array also includes a dielectric layer covering at least a portion of the column conductor, a fuse link coupled between the dielectric layer on the column conductor and the second row conductor.

9 Claims, 5 Drawing Sheets

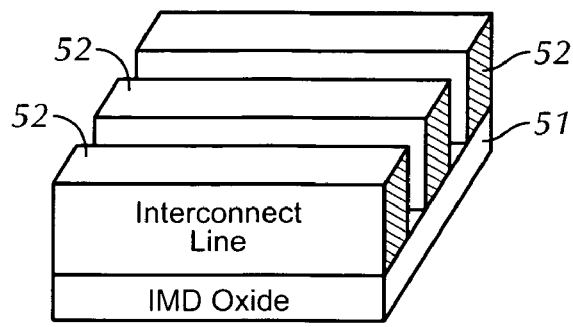
FIG. 2 Pattern the Interconnect as WL
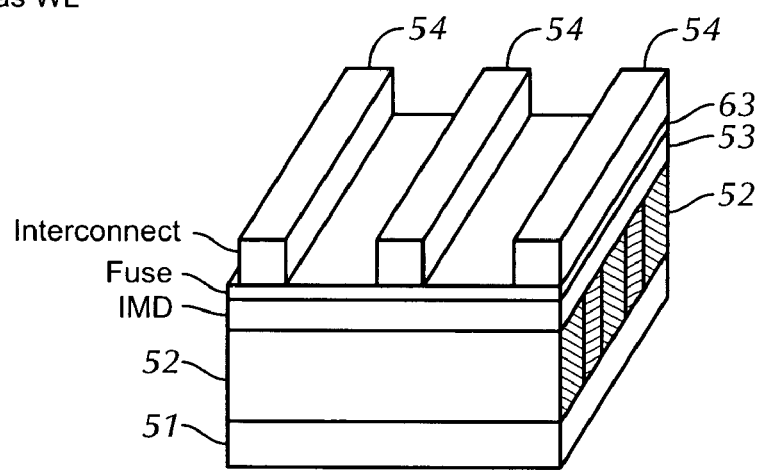
FIG. 3
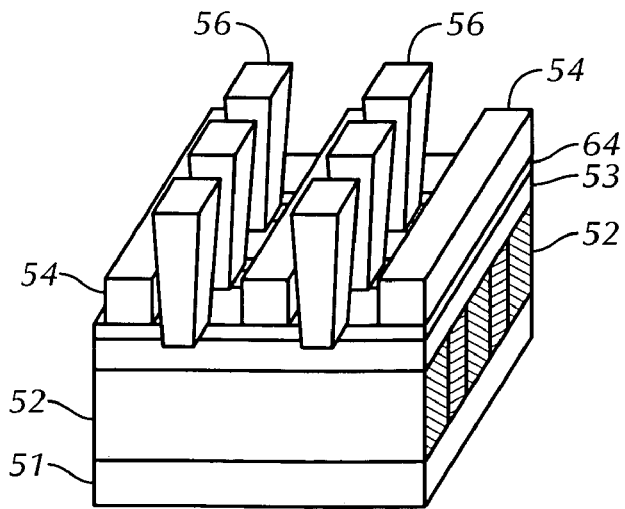
FIG. 4 Pattern Fuse (Isolate) IMD Cont. Etch Stop on WL

DIODE-LESS ARRAY FOR ONE-TIME PROGRAMMABLE MEMORY

BACKGROUND OF THE INVENTION

The present invention relates to a diode-less array for a one-time programmable memory and a method for manufacturing a diode-less array for one-time programmable memory, and more particularly, to a diode-less array for a one-time programmable memory having a dielectric layer and a method for manufacturing a diode-less array for a one-time programmable memory having a dielectric layer.

Erasable programmable read only memory (EPROM) is known in the art. An EPROM is programmed electronically, usually by means of a programming device for storing and downloading information. An EPROM can be erased and reprogrammed. The EPROM typically includes a quartz glass window in the package for erasing the contents by the application of ultraviolet (UV) light. When the quartz glass window is exposed to the UV light for a period of time, the EPROM is erased and can then be reprogrammed.

One-time programmable (OTP) memory is also known in the art. There are several types of OTP memory including fuse, anti-fuse, PROM and mask read only memory (mask ROM). Generally, the content of an OTP is created (programmed) by the customer rather than by the manufacturer. A PROM is a kind of storage device like an EPROM but with no quartz glass window in the package for erasing the contents which reduces the packaging cost but means the device cannot be erased with UV and so can only be written once. A PROM usually comes with all bits reading as logic "1" and blowing a fuse during programming causes each respective bit to read as a logic "0."

Fuse OTP cells include a plurality of "fuses" that are selectively exposed to programming currents in order to burn-out selected fuses to achieve desired programming. Anti-fuse OTP cells use breakdown of metal insulator or diode structures to create two differing resistance states to achieve desired programming. An antifuse functions in an opposite manner as the fuse which allows conduction up to a certain level. An antifuse allows conduction up to a certain level and when that level is exceeded, the antifuse closes the conduction path thereby allowing low resistance current flow through the antifuse.

Mask ROM is a type of OTP that is programmed during fabrication, therefore there is no programming circuitry necessary for a mask ROM. As the name implies, a mask ROM is created during semiconductor fabrication by selectively photomasking the fabricated device to achieve the desired programmed state. However, programming a mask ROM becomes increasingly difficult as memory cell size is further reduced. Additionally, the turn around time (TAT) to manufacture an order may take several weeks because particular masks have to be developed for each application.

It is desirable to provide a diode-less array for OTP memory. Further, it is desirable to provide a OTP memory array that has a dielectric layer.

BRIEF SUMMARY OF THE INVENTION

Briefly stated, the present invention comprises a one-time programmable memory array that includes a first row conductor extending in a first row direction and disposed at a first elevation, a second row conductor extending in a second row direction and disposed at a second elevation and a column conductor extending in a column direction and disposed adjacent to the first row conductor and adjacent to the second row conductor. The column direction being different from the first and second row directions. The array also includes a dielectric layer covering at least a portion of the column conductor, a fuse link coupled between the dielectric layer on the column conductor and the second row conductor.

The present invention also comprises a one-time programmable memory array that includes a plurality of first row conductors extending in a first row direction and disposed at a first elevation, a plurality of second row conductors extending in a second row direction and disposed at a second elevation and a plurality of column conductors extending in a column direction and disposed between adjacent pairs of the plurality of first row conductors and adjacent pairs of the plurality of second row conductors. The second elevation is different than the first elevation. The array also includes a plurality of dielectric layers and a plurality of fuse links. Each of the plurality of dielectric layers covers at least a portion of each one of the plurality of column conductors. Each of the plurality of fuse links is coupled between one of the plurality of column conductors and one adjacent row conductor of one of the plurality of second row conductors.

In another aspect, the present invention comprises a method of forming a one-time programmable memory array having a dielectric layer.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there is shown in the drawings an embodiment which is presently preferred. It should be understood, however, that the invention is not limited to the precise arrangements and instrumentalities shown. In the drawings:

FIG. 2 is a perspective view of a intermetal dielectric (IMD) oxide base and first set of row conductors for forming the OTP memory array of FIG. 1;

FIG. 3 is a perspective view of the base of FIG. 2 with the addition of a fuse layer and a second set of row conductors;

FIG. 4 is a is a perspective view of the base of FIG. 3 having the fuse layer patterned and with the addition of column conductors;

DETAILED DESCRIPTION OF THE INVENTION

Figure 1:
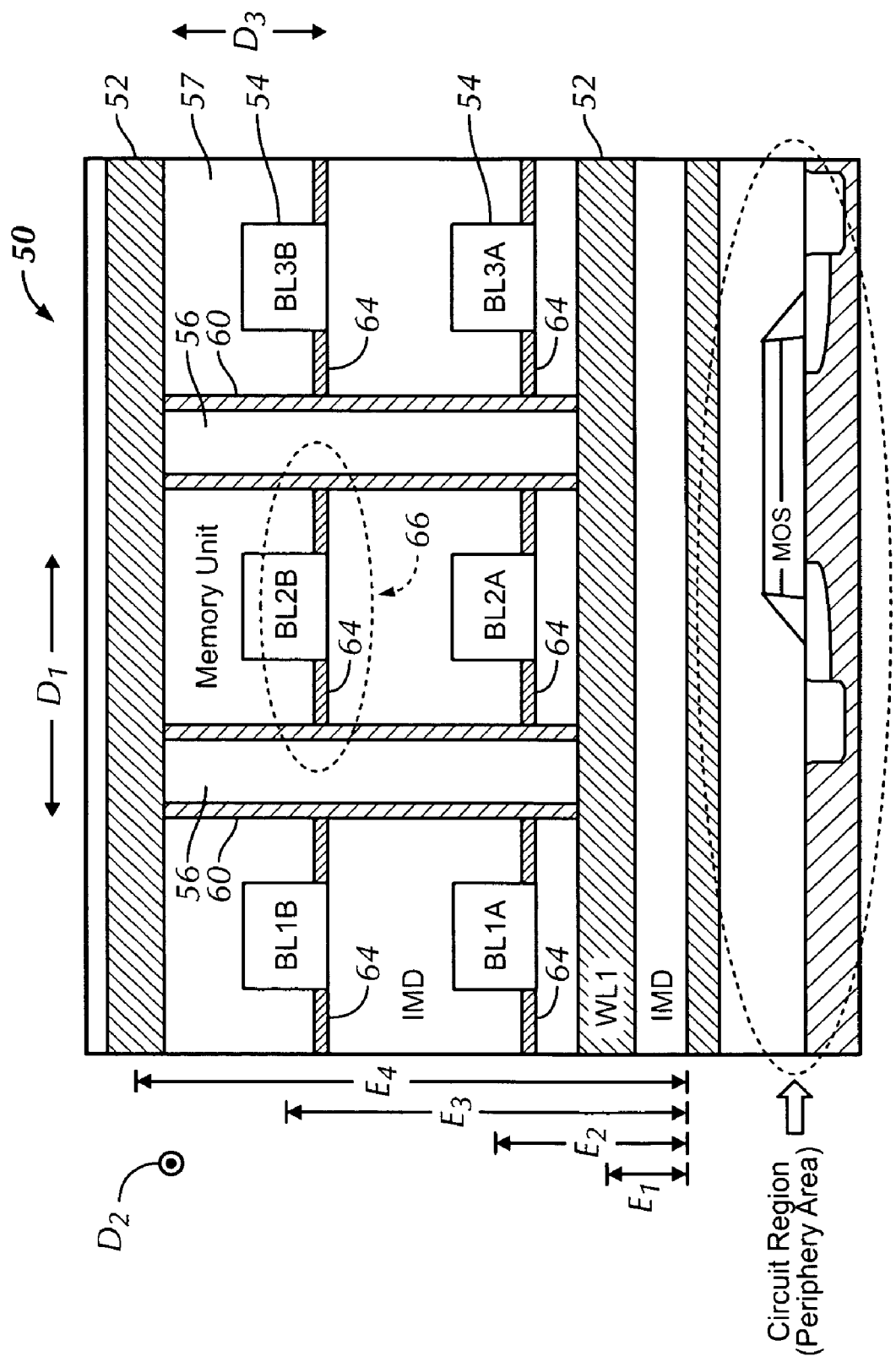
FIG. 1 is a partial elevational cross-sectional view of a one-time programmable (OTP) memory array having a dielectric layer in accordance with the preferred embodiment of the present invention.

Certain terminology is used in the following description for convenience only and is not limiting. The words "right", "left", "lower", and "upper" designate directions in the drawing to which reference is made. The words "inwardly" and "outwardly" refer direction toward and away from, respectively, the geometric center of the object described and designated parts thereof. The terminology includes the words above specifically mentioned, derivatives thereof and words of similar import. Additionally, the word "a," as used in the claims and in the corresponding portions of the specification, means "at least one."

As used herein, reference to conductivity will be limited to the embodiment described. However, those skilled in the art know that p-type conductivity can be switched with n-type conductivity and the device would still be functionally correct (i.e., a first or a second conductivity type). Therefore, where used herein, the reference to n or p can also mean that either n and p or p and n can be substituted therefor.

Furthermore, $n^+$ and $p^+$ refer to heavily doped n and p regions, respectively; $n^{++}$ and $p^{++}$ refer to very heavily doped n and p regions, respectively; $n^-$ and $p^-$ refer to lightly doped n and p regions, respectively; and $n^{--}$ and $p^{--}$ refer to very lightly doped n and p regions, respectively. However, such relative doping terms should not be construed as limiting.

Referring to the drawings in detail, wherein like numerals reference indicate like elements throughout, there is shown in FIGS. 1-9 a one-time programmable (OTP) memory array 50 that includes a first row conductor 52 extending in a first row direction D1 and disposed at a first elevation E1, a second row conductor 54 extending in a second row direction D2 (shown as an arrow coming out of or going into the page in FIG. 1) and disposed at a second elevation E2 and a column conductor 56 extending in a column direction D3 and disposed adjacent to the first row conductor 52 and adjacent to the second row conductor 54. The OTP memory array 50 also includes a dielectric layer 60 covering at least a portion of the column conductor 56 and a fuse link 64 coupled between the dielectric layer 60 on the column conductor 56 and the second row conductor 52. The first row conductor 52 forms a wordline and the second row conductor 54 forms a bitline of the OTP memory array 50.

The first row direction D1 and the second row direction D2 are different. Preferably, the first row direction D1 and the second row direction D2 are orthogonal with respect to each other. Of course, the first and second row directions D1, D2 may be at other angles with respect to each other The fuse link 64 coupled between the dielectric layer 60 on the column conductor 56 and the second row conductor 54 defines a memory cell 66 which "stores" a binary state by programming. For example, when the fuse link 64 of a particular memory cell 66 is intact, then the particular memory cell 66 may be a logic "0" and, if the fuse link 64 of a particular memory cell 66 is opened or "blown," then the particular memory cell 66 may be a logic "1," or vice versa. Of course, once a memory cell 66 is "programmed," by opening the fuse link 64 associated with that memory cell 66, that particular memory cell 66 cannot be un-programmed because the fuse link 64 cannot be restored once opened or burned, thus demonstrating the one time programmable character of the memory array 50.

The dielectric layer 60 is preferably formed of a dielectric material like a nitride or an oxide. Optionally, the dielectric layer 60 may be formed by oxidizing the material of the fuse link 64. The fuse link 64 is preferably formed of doped polysilicon, undoped polysilicon or a thin metal. The first and second row conductors 52, 54 and the column conductor 56 are formed of polysilicon or a metal such as copper, aluminum, germanium, tantalum, silver, gold, nickel, chromium, tin, tungsten, zinc, titanium, indium and the like or combinations thereof.

The OTP memory array 50 more particularly includes a plurality of first row conductors 52 extending in the first row direction D1 and disposed at the first elevation E1, a plurality of second row conductors 54 extending in the second row direction D2 and disposed at the second elevation E2, a plurality of third row conductors 54 extending in the second row direction D2 and disposed at a third elevation E3, a plurality of fourth row conductors 52 extending in the first row direction D1 and disposed at a fourth elevation E4 and a plurality of column conductors 56 extending in the column direction D3 and disposed between adjacent pairs of the plurality of first row conductors 52 and adjacent pairs of the plurality of second row conductors 54. The second elevation E2 is above the first elevation E1, with respect to a base 51 of the OTP memory array 50; the third elevation E3 is above the second elevation E2, with respect to the base 51; and the fourth elevation E4 is above the third elevation E3, with respect to the base 51. Thus, the first-fourth row conductors 52, 54 are in overlying relationship to one another.

The second row conductors 54 includes bitlines BL1A, BL2A, BL3A and BLnA. The third row conductors 54 include bitlines BL1B, BL2B, BL3B and BLnB. The first row conductors 52 include wordlines WL1A, WL2A, WL3A and WLnA. The fourth row conductors 52 include wordlines WL1A, WL2A, WL3A and WLnA. The column conductors 56 interconnect between adjacent wordlines WL1A, WL2A, WL3A, WLnA and the fuse links 64 bridge to individual bitlines BL1A, BL2A, BL3A, BLnA, BL1B, BL2B, BL3B, BLnB so that each bitline BL1A, BL2A, BL3A, BLnA, BL1B, BL2B, BL3B, BLnB is electrically coupled to each of the wordlines WL1A, WL2A, WL3A, WLnA. Accordingly, the OTP memory array 50 also includes a plurality of dielectric layers 60 and a plurality of fuse links 64 for making the interconnections to the individual bitlines BL1A, BL2A, BL3A, BLnA, BL1B, BL2B, BL3B, BLnB. Each of the plurality of dielectric layers 60 covers at least a portion of each one of the plurality of column conductors 56. The wordlines WL1A, WL2A, WL3A, WLnA, the bitlines BL1A, BL2A, BL3A, BLnA, BL1B, BL2B, BL3B, BLnB, the dielectrically covered column conductors 56 and the fuse links 64 form a three-dimensional (3D) inter-layered matrix. Since the OTP memory array 50 is a three-dimensional (3D) memory array code efficiency and memory density are both improved per unit area/volume as compared to a mask ROM and a conventional PROM that use diodes.

The dielectric layers 60 are used in lieu of a diode. The function of a diode in a OTP memory array 50 is to reduce parasitic current that flows through other memory units 66 to the current sensor because diodes have large forward and small reverse current characteristics. The dielectric layers 60 perform this function as well in lieu of a diode. If the dielectric layers 60 are formed sufficiently thin, the dielectric layers 60 have a large tunneling current, especially direct tunneling current. The parasitic current becomes very small as the parasitic current flows through other memory units 66 because it flows through many dielectric layers 60 in its path. The tunneling current is expressed as follows:

$$J_{DT} \cong \frac{4\pi q m_1 k_B T}{h^3} \int_0^{E_b} TC(E) \ln\left[\frac{e^{(E_{Fn1}-E_{c1}-E)/k_B T}+1}{e^{(E_{Fn3}-E_{c1}-E)/k_B T}+1}\right] dE$$

using a Wentzel-Kramers-Brillouin (WKB) calculation of the tunneling coefficient through a trapezoidal barrier (i.e., direct tunneling). The WKB tunneling coefficient is given by, $$TC(E) = \exp\left(-\frac{4}{3}\left(\frac{8\pi^2 m_2}{h_2}\right)^{1/2}\right.$$
$$\left.\left(\frac{t_{ins}}{qV_{ins}}\right)\left[\left(E_{b1} - E - q\frac{V_{ins}}{t_{ins}}b\right)^{3/2} - \left(E_{b1} - E - q\frac{V_{ins}}{t_{ins}}a\right)^{3/2}\right]\right)$$

where, $E_{b1}$ is the barrier height on the incident side, $m_2$ is the effective tunneling mass of electrons in the insulator and a, b are classical turning points.

Fowler-Nordheim (FN) tunneling current is expressed as follows:

$$Jdt = A\left(\frac{V}{T_{ins}}\right)^2 \exp\left[-\frac{B}{(V/T_{ins})}\right]$$

where, A, B are constants, Tins is the dielectric thickness and V is bias across the dielectric 60.

The OTP memory array 50 may include any number of bitlines BL1A, BL2A, BL3A, BLnA, BL1B, BL2B, BL3B, BLnB and any number of wordlines WL1A, WL2A, WL3A, WLnA. Moreover, there may be additional layers of bitlines BL1A, BL2A, BL3A, BLnA, BL1B, BL2B, BL3B, BLnB and wordlines WL1A, WL2A, WL3A, WLnA that may be interconnected in different manners to achieve even higher density OTP memory arrays 50. OTP memory arrays 50 may be several gigabytes (GB) or more. For example, a one GB OTP memory array 50 may be stacked by eight elevations so that the array 50 includes 16 Million (M)*8 bitlines and 8M wordlines.

Figure 8:
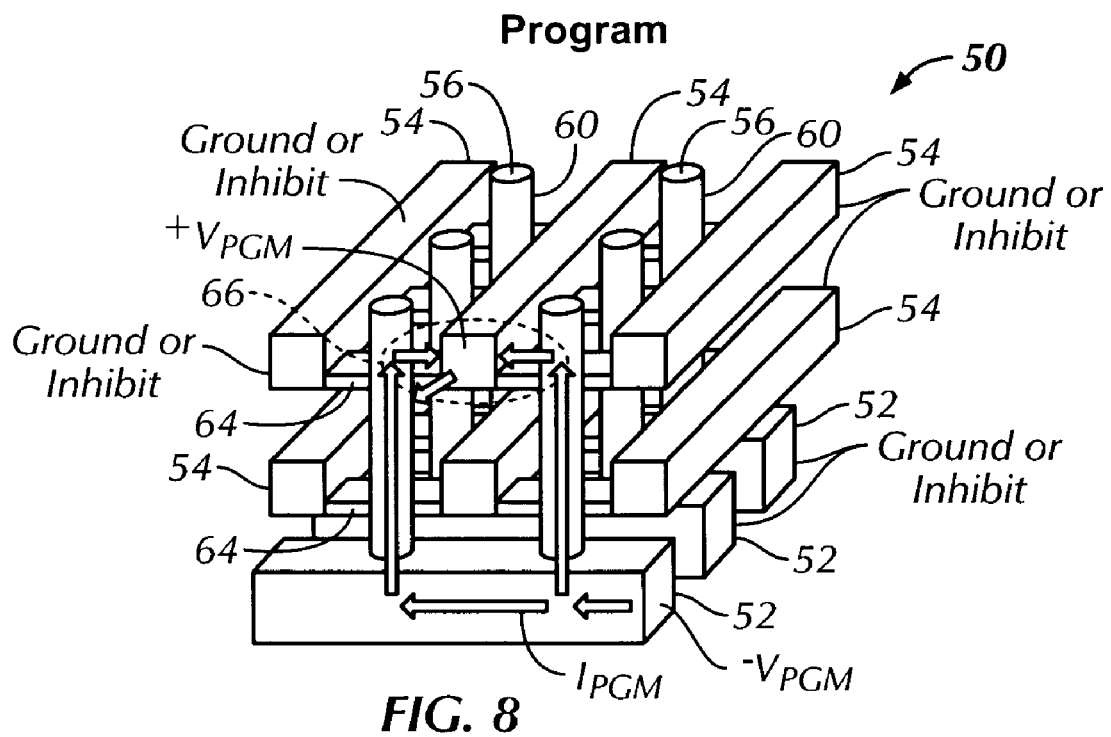
FIG. 8 is a perspective view of the OTP memory array of FIG. 6 configured for programming one of a plurality of memory cells.

Each memory cell 66 has two (binary) memory states: "programmed" and "un-programmed." The un-programmed state is when the fuse link 64 is intact, and the programmed state is when the fuse link 64 is "blown" (i.e., an open circuit). Referring to FIG. 8, in order to program the OTP memory array 50, a programming voltage $V_{PGM}$ is selectively applied to a particular wordline 52 and a particular bitline 54 is selectively connected to return (ground) or vice versa. The programming voltage $V_{PGM}$ in conjunction with the resistance in the path to the return permits a current $I_{PGM}$ to the return. The programming current $I_{PGM}$ is sufficient to cause the particular fuse link 64 between the dielectric layer 60 on the respective column conductor 56 and the bitline 54 to blow (i.e., open circuit). Once "programmed," a particular bitline 54 cannot be "un-programmed." For example, as shown in FIG. 8, a positive programming voltage $V_{PGM}$ is applied to bitline BL2B and a negative programming voltage $V_{PGM}$ is applied to wordline WL1A. Current $I_{PGM}$ flows through the path shown by the small directional arrows including the wordline WL1A, the column conductor 56, the fuse link 64 and bitline BL2B. The current is sufficient to blow the fuse link 64 connected between BL2B and the column conductor 56 thereby programming the particular memory cell 66 associated with bitline BL2B.

The programmed state may represent binary value "1," and the un-programmed state may represent binary value "0." Alternatively, the programmed state may represent binary value "0," and the un-programmed state may represent binary value "1."

Figure 9:
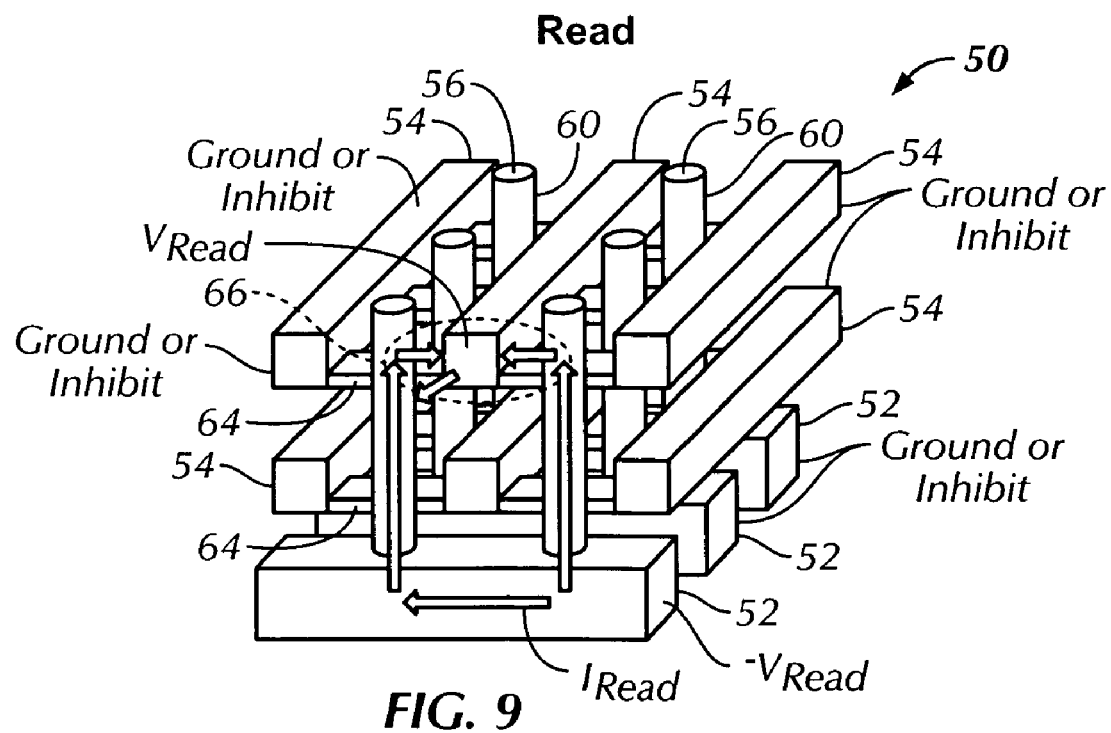
FIG. 9 is a perspective view of the OTP memory array of FIG. 6 configured for reading one of a plurality of memory cells.

FIG. 9 shows one way that the memory array 50 may be read by applying read voltage $V_{read}$ to particular wordlines WL1A, WL2A, WL3A, WLnA and bitline BL1A, BL2A, BL3A, BLnA, BL1B, BL2B, BL3B, BLnB combinations. For example, as shown in FIG. 9, a positive read voltage $V_{read}$ is applied to bitline BL2B and a negative read voltage $V_{read}$ is applied to wordline WL1A. Current $I_{read}$ flows through the path shown by the small directional arrows including the wordline WL1A, the column conductor 56, the fuse link 64 and bitline BL2B. A current detector (not shown) is used to sense the presence or absence of read current $I_{read}$. If the read current $I_{read}$ is at an expected level, then the fuse link 64 for the particular memory cell being measured must be intact, and therefore, the memory cell 66 was not programmed (e.g., logic 0). But, if there is no measurable read current $I_{read}$, then the fuse link 64 for the particular memory cell being measured must be blown, and therefore, the memory cell 66 was programmed (e.g., logic 1).

The wordlines 52 may be coupled to a Y decoder (not shown) and the bitlines 54 may be coupled to an X decoder (not shown) for reading the states of the various memory cells 66 within the OTP memory array 50 by multiplexing or similar techniques.

Figure 5:
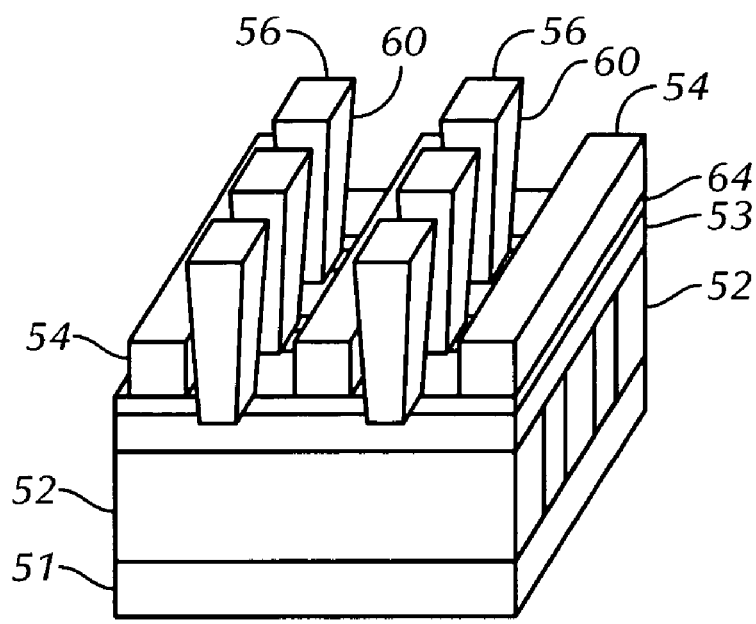
FIG. 5 is a is a perspective view of the base of FIG. 4 with a dielectric layer added to the column conductors.
Figure 6:
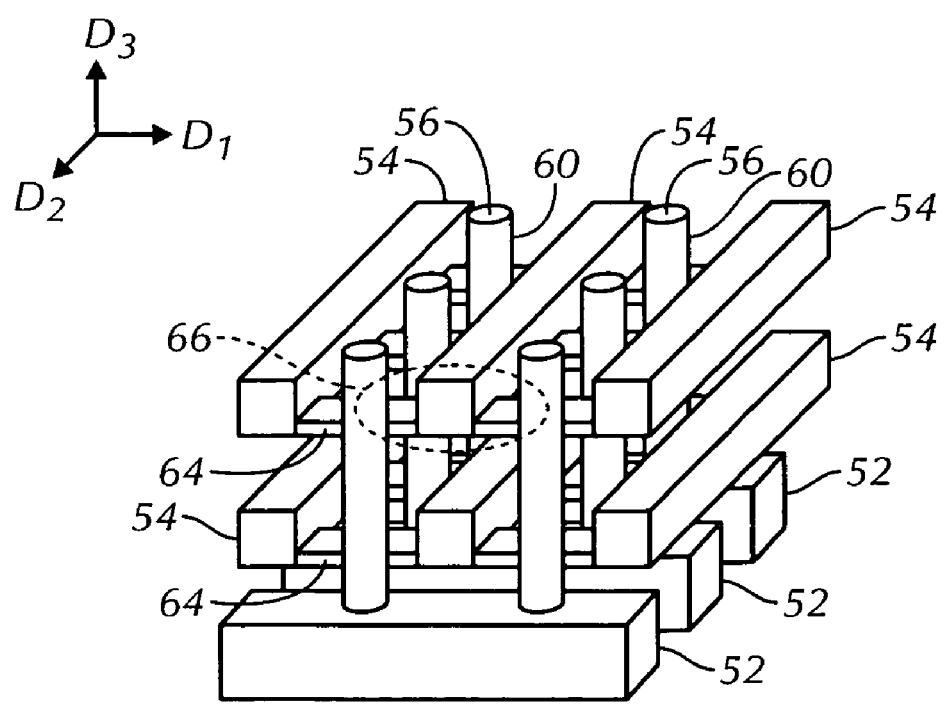
FIG. 6 is a perspective view of the OTP memory array of FIG. 1 without an insulator filling voids therein.
Figure 7:
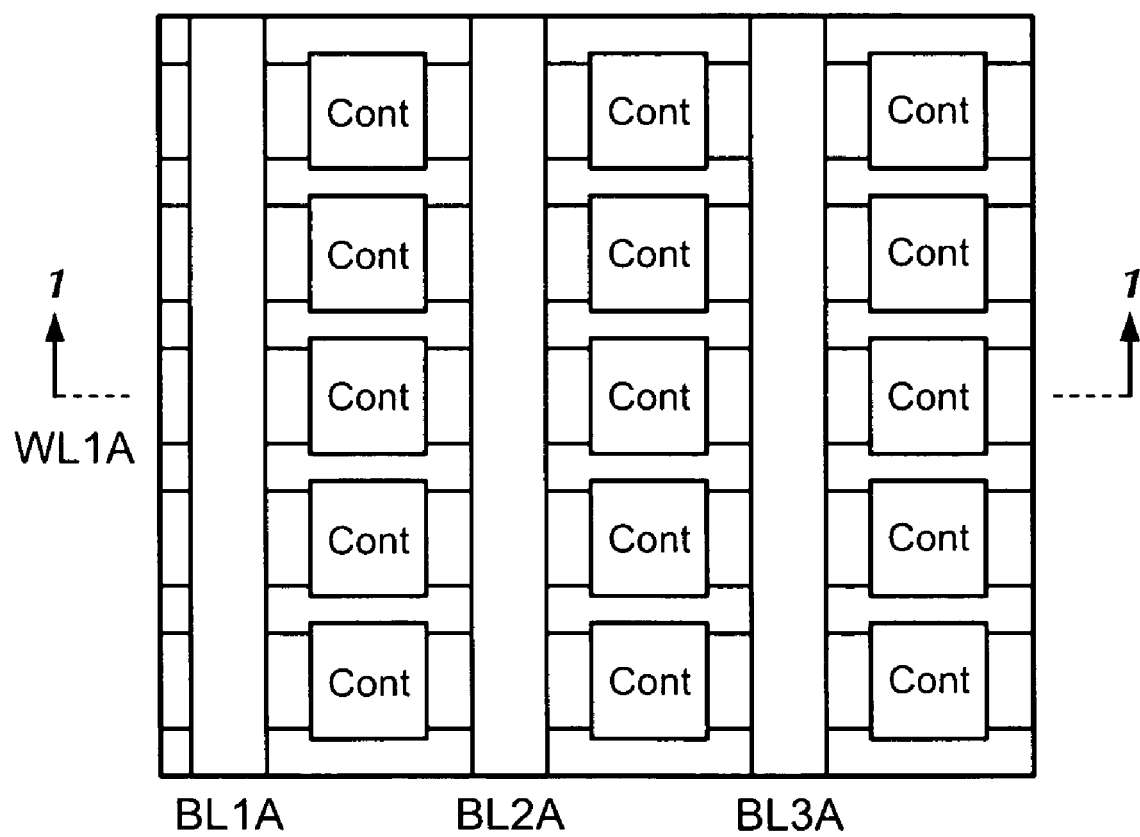
FIG. 7 is a top plan view of the OTP memory array of FIG. 1.

FIGS. 2-6 demonstrate exemplary steps for fabricating the OTP memory array 50. FIG. 2 shows that the process begins with an intermetal dielectric (IMD) oxide base 51 on which a first set of row conductors 52 are formed. A layer of conductive material can be grown or deposited onto the IMD oxide base 51 and then patterned and etched to form the first set of row conductors 52. A dielectric or insulating material is then filled into the patterned spaces between the first set of row conductors 52. Alternately, a layer of dielectric material 53 can be deposited on the IMD oxide base 51, and the dielectric material 53 can be patterned and etched for filling by conductive material to form the first set of row conductors 52 and then covered with the dielectric material 53. FIG. 3 shows the IMD base 51 with the first set of row conductors 52 of FIG. 2 with the addition of another IMD oxide layer 53, a fuse layer 63 and a second set of row conductors 54. The fuse layer 63 may be a deposition of polysilicon forming a thin film. The fuse layer 63 is patterned (striped) to create fuse links 64. The second row of conducts 54 may be formed by depositing a relatively thick layer of metal or polysilicon and then patterning the material to create individual bitlines BL1A, BL2A, BL3A, BLnA. Alternately, individual bitlines BL1A, BL2A, BL3A, BLnA can be created before the formation of fuse link. FIG. 4 shows the partially manufactured memory array of FIG. 3 having the fuse layer 63 patterned (striped) to thereby form fuse links 64 and with the addition of column conductors 56 and each of the column conductors 56 must cut off each of the fuse links 64 into two parts. FIG. 5 shows the partially manufactured memory array of FIG. 4 with a dielectric layer 60 added to the column hole. The dielectric layer 60 is attached to the sidewall of column hole. A conductive material such as tungsten is filled into the column hole to form the column conductors 56. FIG. 6 shows that another fuse layer 63 has been added above the second layer of row conductors 54 and that another layer of row conductors 54 has been formed in order to create the OTP memory array 50 of FIG. 1 without the insulator 57 filling voids therein. The fuse layer 63 is patterned (striped) to create fuse links 64, and the second layer of row conductors 54 are patterned to create individual bitlines BL1B, BL2B, BL3B, BLnB. The insulating material 57 may then be added by refill or deposition and the like to yield the OTP memory array 50 of FIG. 1. Alternately, memory array 50 of FIG. 1 can be fabricated by another process flow. For example, the relative process of the dielectric layer 60 and column conductor 56 showed in FIGS. 4-5 can be initially skipped to stack BL1A, BL2A, BLnA, BL1B, BL2B, BLnB, and then finally, create dielectric layer 60 and column conductor 56.

The process may be repeated a number of times to stack a plurality of row conductors 52, 54, fuse links 63, column conductors 56, bitlines BL1A, BL2A, BL3A, BLnA, BL1B, BL2B, BL3B, BLnB, and wordlines WL1A, WL2A, WL3A, WLnA, thereby forming a larger OTP memory array 50 having a plurality of memory cells 66.

The various layers may be formed in any of a variety of ways known in the art. For example, the layers may be grown or deposited. Deposition may be by chemical vapor deposition (CVD), physical vapor deposition (PVD), evaporation, sputtering and the like. Patterns may be formed on the surface of the semiconductor substrate by photolithography or photomasking ("masking") techniques. Layers may be etched back by mechanical etching or by chemical etching and/or chemical mechanical polishing and the like. Additionally, known methods of doping, heat treating, diffusing, etching, layering, trenching, polishing and the like, may be utilized in the fabrication process of the OTP memory array 50 without departing from the present invention.

From the foregoing, it can be seen that the present invention is directed to a diode-less array for one-time programmable memory having a dielectric layer and a method for manufacturing a diode-less array for one-time programmable memory having a dielectric layer. It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A one-time programmable memory array comprising:
   a first row conductor extending in a first row direction and disposed at a first elevation;
   a second row conductor extending in a second row direction and disposed at a second elevation;
   a column conductor extending in a column direction and disposed adjacent to the first row conductor and adjacent to the second row conductor, the column direction being different from the first and second row directions;
   a dielectric layer covering at least a portion of the column conductor; and
   a fuse link coupled between the dielectric layer on the column conductor and the second row conductor.

2. The one-time programmable memory array according to claim 1, wherein the dielectric layer is one of nitride and silicon dioxide.

3. The one-time programmable memory array according to claim 1, wherein the fuse link is formed of doped or undoped polysilicon.

4. The one-time programmable memory array according to claim 1, wherein the first row conductor forms a wordline and the second row conductor forms a bitline.

5. The one-time programmable memory array according to claim 1, wherein the first and second row conductors and the column conductor are formed of at least one of polysilicon, copper, aluminum, germanium, tantalum, silver, gold, nickel, chromium, tin, tungsten, zinc, titanium and indium.

6. The one-time programmable memory array according to claim 1, wherein the first row direction and the second row direction are different.

7. The one-time programmable memory array according to claim 1, wherein the first row direction and the second row direction are orthogonal with respect to each other.

8. The one-time programmable memory array according to claim 1, further comprising:
   an insulator filling voids between the first and second row conductors, the fuse link and the column conductor.

9. A one-time programmable memory array comprising:
   a plurality of first row conductors extending in a first row direction and disposed at a first elevation;
   a plurality of second row conductors extending in a second row direction and disposed at a second elevation, the second elevation being different than the first elevation;
   a plurality of column conductors extending in a column direction and disposed between adjacent pairs of the plurality of first row conductors and adjacent pairs of the plurality of second row conductors;
   a plurality of dielectric layers, each of the plurality of dielectric layers covering at least a portion of each one of the plurality of column conductors; and
   a plurality of fuse links, each of the plurality of fuse links being coupled between one of the plurality of column conductors and one adjacent row conductor of one of the plurality of second row conductors.

* * * * *